(12) United States Patent
Mei

(10) Patent No.: US 6,680,128 B2
(45) Date of Patent: Jan. 20, 2004

(54) METHOD OF MAKING LEAD-FREE SOLDER AND SOLDER PASTE WITH IMPROVED WETTING AND SHELF LIFE

(75) Inventor: Zequn Mei, Fremont, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 63 days.

(21) Appl. No.: 09/963,605

(22) Filed: Sep. 27, 2001

(65) Prior Publication Data

US 2003/0059642 A1 Mar. 27, 2003

(51) Int. Cl.[7] .................... B23K 35/22; B32B 15/02
(52) U.S. Cl. .................... 428/570; 427/216; 427/217; 427/437
(58) Field of Search .................... 428/570; 427/437, 427/216, 217

(56) References Cited

U.S. PATENT DOCUMENTS

| | | | | | |
|---|---|---|---|---|---|
| 1,986,197 | A | * | 1/1935 | Harshaw | ........................ 419/6 |
| 3,617,384 | A | * | 11/1971 | Kamai et al. | ................. 429/207 |
| 5,654,800 | A | * | 8/1997 | Svetkoff et al. | .............. 356/602 |
| 5,942,185 | A | * | 8/1999 | Nakatsuka et al. | .......... 420/562 |
| 6,390,355 | B1 | * | 5/2002 | Jung | ........................ 228/248.1 |
| 6,416,590 | B1 | * | 7/2002 | Hirata et al. | ................... 148/24 |
| 6,457,228 | B1 | * | 10/2002 | Arai et al. | .................. 29/592.1 |

FOREIGN PATENT DOCUMENTS

| JP | 61-009992 | * | 1/1986 |
|---|---|---|---|
| JP | 63-177995 | * | 7/1988 |
| JP | 08-164496 | * | 6/1996 |

* cited by examiner

Primary Examiner—John J. Zimmerman

(57) ABSTRACT

Solder compositions, solder pastes and methods of manufacturing thereof having a solder material coated with a coating material by an immersion coating process or an electroless plating process. The solder composition and solder pastes are substantially lead-free and have melting temperatures approaching those of traditional tin-lead solders.

19 Claims, 9 Drawing Sheets

US 6,680,128 B2

METHOD OF MAKING LEAD-FREE SOLDER AND SOLDER PASTE WITH IMPROVED WETTING AND SHELF LIFE

TECHNICAL FIELD

The present invention relates to solder compositions, solder pastes and manufacturing methods thereof. More particularly, the present invention relates to a method of making solder powders and solder pastes substantially free of lead which provide for the relatively low operating temperatures associated with lead-based solders.

BACKGROUND

The electronic packaging and assembly industry is being pressured to convert to lead-free solders in response to growing concerns that the large number of electronic devices currently employing lead may create a public health risk over time. In response to the pressure, several lead-free solders have been proposed to replace the traditional tin-lead solders.

One such substitute is the family of tin-silver solders. However, this substitute is undesirable because of the increased operating temperature required to melt the solder compositions. Traditional tin-lead solder has a melting point of about 183° C. Replacing the traditional tin-lead solder with a tin silver solder significantly increases the operating temperature to at least 215° C. A concern about the use of these tin-silver solders is that such a higher operating temperature places significant strain on both the electronic components and the operating costs associated with these solders. This 30° C. increase in temperature significantly increases costs of manufacturing electronic components because new materials for the circuit boards and electronic systems must be obtained to compensate for the increase in temperature they will be subjected to during processing.

Another potential solution is the use of tin-zinc solders. These tin-zinc solders are generally more desirable because the operating temperature is closer to the traditional tin-lead solders; however, these solders also have significant drawbacks. For example, zinc is a very reactive metal and oxidizes very quickly. This reactivity creates many problems when used in solder compositions. First, oxidized zinc creates wetting problems. Second, the zinc tends to react quickly with other components typically found in solder pastes, such as flux, thereby significantly reducing the shelf-life of the solders and solder pastes. Thus, in order to take advantage of the beneficial properties of tin-zinc solders, active steps must be taken to keep zinc from oxidizing and reacting.

Solutions to this problem often focus on the type of flux selected for use in conjunction with the solder powders. Other solutions include coating the zinc with another metal to slow the oxidation of the zinc. Typical coating procedures include hot-dipping, foiling and electroplating. One such coating solution is discussed in U.S. Pat. No. 6,186,390, which discloses a solder material and manufacturing method in which a solder material has a first layer (such as a sheet) composed of zinc and a second layer composed of tin. The two sheets are then rolled into a wire such that the tin layer surrounds the zinc layer. This coated wire creates a tin-zinc solder material in which the majority of the zinc is surrounded by tin. While this patent proposes a solution to the problem of zinc oxidation, the method of making these materials is extremely time consuming, likely very expensive and is not suitable for industrial processes for coating small particles already in powder form.

Other known coating methods such as hot dipping and electroplating, are also undesirable because of the nature of the materials selected and increased manufacturing costs. For example, hot dipping is generally not a viable solution for solder materials that have a lower melting temperature than the coating material itself.

Therefore, it would be desirable to provide a tin-zinc solder material and method for manufacturing thereof that takes advantage of the properties of tin-zinc solders, solves the problems of oxidation of zinc, and is easily and inexpensively manufactured.

SUMMARY

The present invention provides for a substantially lead-free solder composition with improved wetting properties and extended shelf-life comprising a solder material and an immersion coating having a thickness between about 0.5 and 2 microns disposed about the solder material.

The solder composition is most preferably a metal alloy of tin and zinc coated with a coating material. The coating material is preferably selected from copper, silver, palladium, tin and gold. Additionally, the metal alloy contains a melting point reducing agent ("X"), to lower the melting temperature such that it is less than about 192° C. The melting point reducing agent is an element preferably selected from indium, silver and bismuth. The resulting tin-zinc-X alloy is preferably provided in powder form with spheres approximately 30 microns in diameter. The coating is approximately 1 micron thick and is preferably tin.

The present invention also provides a method of making a coated solder composition comprising the steps of providing a solder material comprising tin and zinc and coating the solder material with about 0.5 to about 2 microns of a coating material by immersion coating or electroless plating. A method of making a solder paste is also provided by mixing the coated solder powder with an effective amount of flux.

These solder compositions and methods of manufacturing thereof provide significant advantages over the known solder compositions and the known methods of manufacturing these compositions.

DETAILED DESCRIPTION

The present invention is directed to solder compositions and solder pastes that have lower melting points similar to that of typical tin-lead solders, effective wetability properties and an increased shelf life. The present invention is also directed to methods of manufacturing solder compositions and solder pastes.

The solder composition according to the present invention has a solder material and a coating disposed about the solder material. The solder material may be in a number of forms including, wire, sheets, granules, particles, etc. Preferably the solder material is a plurality of alloy particles.

Figure 1:
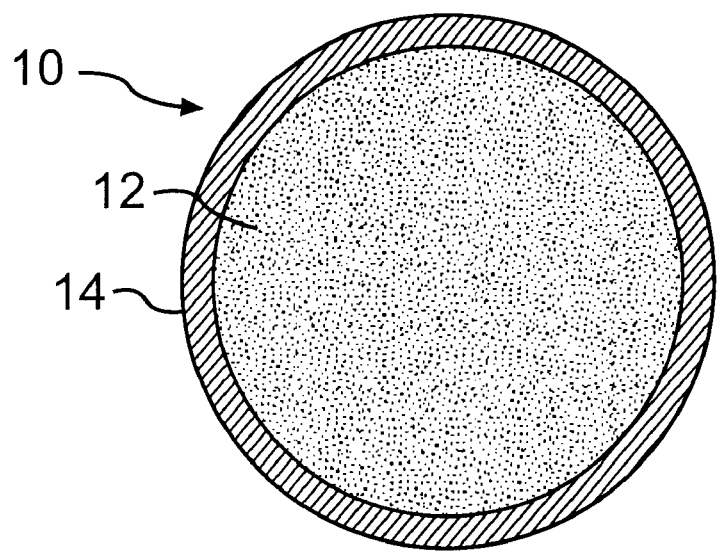
FIG. 1 is a schematic representation of a coated alloy particle in accordance with one embodiment of the present invention.

FIG. 1 is a schematic representation of a coated solder material 10 in accordance with one embodiment of the present invention showing a solder material 12 coated by a coating material 14. The diameter of the solder material 12 is preferably between 25 and 35 microns and the thickness of the coating material 14 is preferably between 0.25 and 2 microns. The coating material preferably has a melting temperature greater than the melting temperature of the solder material. The melting temperature of the solder composition is preferably less than about 192° C. The solder composition may also be mixed with an effective amount of flux thereby creating a solder paste.

The solder material can be a mixture of any of these materials or an alloy of any of these materials. The solder material is preferably selected from copper, tin, zinc, silver, gold, and palladium. More preferably, the solder material comprises tin and zinc, most preferably, it comprises a eutectic tin-zinc alloy. The amount of tin is preferably between about 30% and about 95% by weight, more preferably between about 88% and about 92% by weight, and most preferably 91% tin, 9% zinc, by weight.

The solder material can also include a melting point reducing agent. The melting point reducing agent can be any material selected to lower the overall melting temperature of the solder composition to a temperature approaching that of traditional tin-lead solders. Preferably this melting point reducing agent is a metal, more preferably this melting point reducing agent is selected from indium, silver and bismuth. The melting point reducing agent can be mixed into the solder material or may be combined with the solder material in the form of an alloy.

The amount of melting point reducing agent is selected depending upon the agent selected, the solder material, and the desired melting temperature of the solder composition. The selection of the various components and the weight percentages of the solder material preferably produces solder compositions with a melting temperature of between about 185° C. and about 192° C.

Solder materials 12, such as alloy particles, for use in accordance with the present invention can be prepared by conventional means such as melting and atomizing an alloy of materials to form alloy particles. Both amorphous and spherical alloy particles are suitable for use in accordance with the present invention. Particularly preferred alloy particles include tin-zinc particles such as eutectic 91Sn-9Zn available commercially in powder form from Indium Corp of America.

The coating material is selected from metals, polymers, and alloys of metals. Preferably the coating material is a metal coating, more preferably the coating material is selected from tin, copper, silver, palladium or gold. Most preferably, the coating material is tin, for this provides an effective solder composition and paste that is also economically acceptable for use in commercial processes.

The coating material 14 is preferably between 0.5 and 2 microns thick. Since the coating material generally has a higher melting temperature than the solder material, and is most preferably tin, which has a melting temperature of approximately 232° C., the coating thickness is selected so that during use, the solder material melts the coating from within the solder composition. The selected coating thickness must also be sufficient to allow the solder composition as a whole to melt at about 192° C. or less.

The thickness of the coating material 14 in conjunction with the selection of a coating material with a higher melting point than the solder material 12 provides for a solder composition or solder paste that remains coated right up until the solder is reflowed. This assures that the solder material will not oxidize prior to re-flow. This significantly improves both the shelf life and wetability of solder compositions and solder pastes according to the present invention. Selection of a coating material with a melting point lower than the solder material would likely result in melting of the coating prior to the alloy particles which in turn potentially affects the wetting properties of the solder composition resulting from oxidation of the metal within the solder material.

For solder compositions using alloy particles as the solder material, the coated solder material is preferably in the range of 25 to 35 microns in diameter, more preferably in the range of 28 to 32 microns, and most preferably 30 microns in diameter.

The coated solder composition 10 of the present invention is also suitable for use in solder pastes which can be prepared by combining the coated solder composition with a flux. The specific flux ingredients used in the solder paste of the present invention are not critical. Any flux ingredients known to those skill in the art can be employed in the solder paste of the present invention. Typically, however, the flux will comprise at least one of the following ingredients: a rosin such as a gum rosin, wood rosin, or tall oil rosin; derivatives of rosin such as dimerized resin, saponified resin or rosin derived from ester resin (also known as "esterdome"); an activator such as an acid, e.g., an aliphatic acid, mineral acid, or aromatic acid; or an amine, e.g., an aliphatic amine or a halide salt of an amine; and a solvent such as an alcohol, glycol, ester, ketone, aromatic solvent, and the like.

The solder paste of the present invention may also contain other ingredients such as for example, rheological control agents such as caster oil and suspending agents, i.e., thickening agents such as, cellulose derivatives and ethoxylated amines. The selection of specific flux ingredients, including those ingredients known to those skilled in the art which are not specifically described herein, and their proportions, is known to those skilled in the art.

The coated solder composition 10 is mixed with the flux to a relatively uniform distribution. Typically, the solder composition will be combined with the flux to form a paste comprising from about 50% (by volume) solder composition to 50% (by volume) flux.

The concentration of coated solder powder 10 in the solder paste can affect various properties of solder paste such as, for example, viscosity, ease of deposition, slumping, tack retention and shelf life. The concentration of solder powder in the paste also affects the thickness of the solder remaining after the paste is re-flowed. High concentrations of solder powder are desirable to provide a solder thickness which is sufficient to provide the required degree of electrical conductivity and mechanical strength as well as to provide adequate spacing between the component being soldered and the substrate surface to facilitate cleaning.

According to another embodiment of the present invention, a method for producing a coated solder composition and a solder paste is provided. The method for producing a solder composition comprises obtaining a solder material and coating the solder material with an amount of coating material thereby creating a coated solder composition. The coating material may have a melting point greater than the solder material. The coated solder composition may also be mixed with an effective amount of flux thereby creating a solder paste.

The coating material 14 is applied to the solder material in an amount effective to inhibit oxidation of the solder material. It has been found that an amount of coating material as little as 5% (by weight) of the overall coated composition is effective to inhibit oxidation. The effective amount of coating is, preferably less than about 15% (by weight) based on the total weight of the coated solder composition.

The coating step is preferably achieved through immersion coating or electroless plating. Most preferably the coating is an immersion coating. Immersion coating is based on the theory that any metal can be made to form immersion deposits on a less noble metal. The measure of the "nobleness" is based on the electromotive force (emf) of elements. For solder material, such as tin-zinc alloys, several metals may be used for immersion coating. These metals include tin, copper, silver, gold, and palladium. Although the immersion solutions for various immersion coatings may be very complex, the basic reaction that occurs is a simple displacement reaction. The metal ions in the immersion solution obtain electrons from the tin and zinc in the alloy particles, reduce to original metals and deposit on the surface of the alloy particles.

An immersion coating is desirable because it allows for a uniform, thin coating to be deposited on the solder material. This coating step is effective not only on larger materials such as wires, sheets, etc., but also on very small particles of as little as about 10–40 microns in diameter and is easily and cheaply integrated into industrial processes.

An added benefit of an immersion coating is that the immersion reaction is self-limiting. In other words, once the surface of the alloy particle is completely covered with the coating metal, there is no longer contact and electron exchange between the immersion solution and the alloy particles and the reaction therefore stops. Because of the self-limiting nature, there is a practical upper limit of deposit thickness that can be obtained. Generally, this upper limit is of the order of 0.2 microns for immersion coating with gold and is about 2 microns for immersion coating with tin. The result is a uniform, thin coating that is not time dependent.

Moreover, immersion coating provides a simple and effective method for coating very small particles (in the range of 10 to 40 microns) with a thin layer (0.5 to 2 microns) of tin.

Electroless plating produces a metal coating by the controlled auto-catalytic reduction of metallic cations from aqueous solution, without the use of an externally applied potential. A chemical reducing agent in the solution supplies the electrons for the reduction of the metallic salts to their elementary form. The reduction can only occur at a catalytic surface. This requires that the metal being deposited is itself catalytic in order that deposition may be maintained.

Electroless plating differs from immersion coating in the supplier of electrons. In electroless plating, electrons are provided by a reducing agent present in the solution. In an immersion process, electrons are provided by the substrate. An immersion process is self-limiting, because once substrate is covered with deposited metal, the supply of electron is closed. An electroless process is not self-limiting, because the electron supplier, the reducing agent, is present in the solution. Also for an immersion process to work, the atoms on the substrate should have higher tendency to give up electron than the metal The electroless plating and immersion coating procedures are preferred because they do not require a power supply. Other methods such as electrolytic plating require an external power supply.

Methods such as foiling impose a mechanical limit on the thickness of the coated material that is easily achievable. Typically, in the case of foiling, the coating layer can only be approximately 25 microns thin. Once the coating layer and the other layer are combined and folded, this sheet, or wire, must then be drawn out to decrease the thickness of the sheet and/or the diameter of the wire thereby increasing the time and expense of producing the solder material.

Surprisingly, it has been found that tin-zinc alloy particles can be completely coated using an immersion-tin process. As described above, an immersion process is a displacement of a less noble metal by a more noble metal. Since the preferred tin-zinc alloy contains only 9 wt % of zinc, and the tin ions in an immersion-tin solution can react with zinc, not tin, intuitively, the coating should cover only 9% of the spherical surface of a tin-zinc powder.

Figure 2:
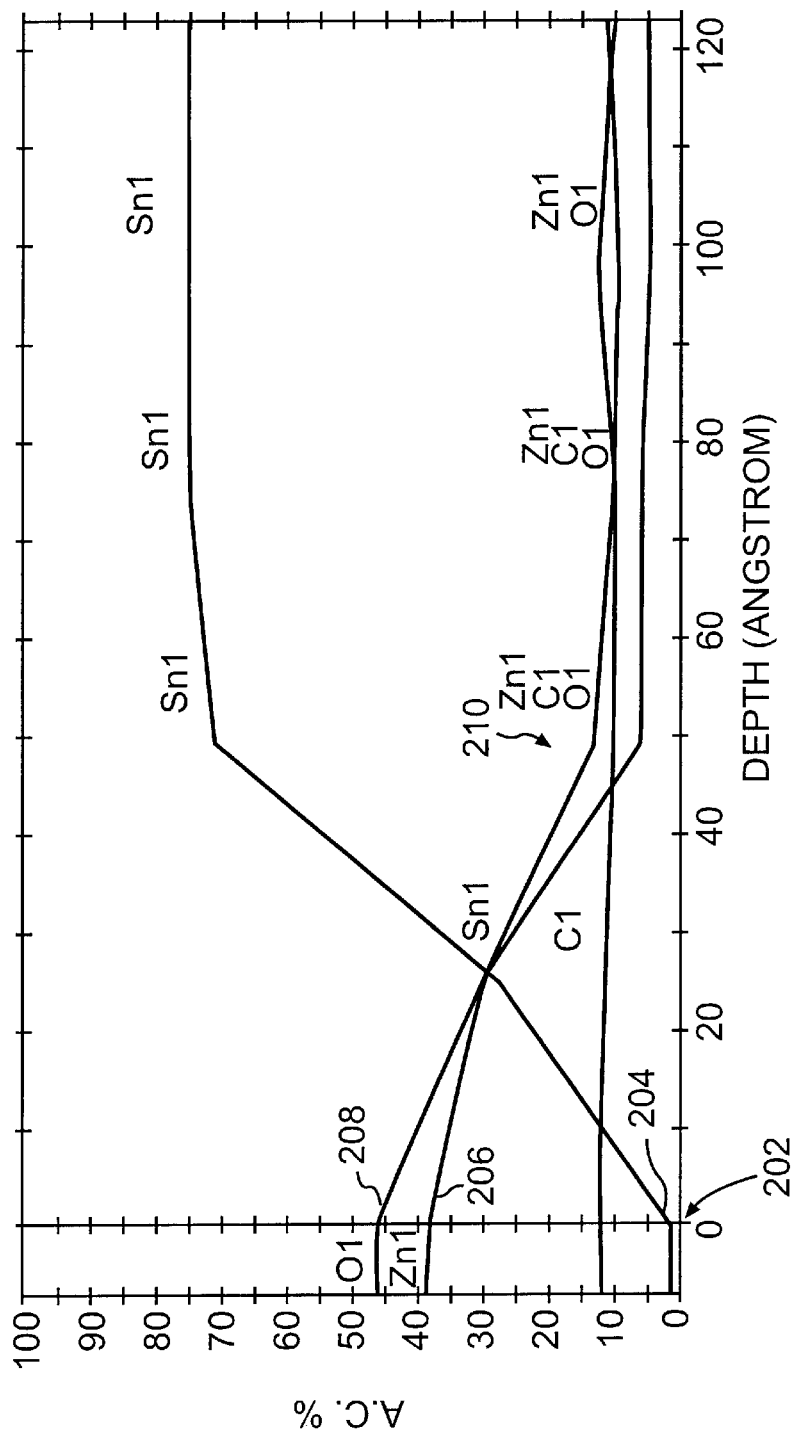
FIG. 2 is a plot showing the atomic composition of a eutectic 91Sn-9Zn alloy particle vs. the distance from the surface towards the inside of the alloy particle, measured by an Auger microscope.

However, it has been discovered that the spherical surface of a eutectic 91Sn-9Zn powder is completely covered with a ZnO shell, as shown by the Auger spectroscope plot in FIG. 2. The Auger spectroscope is a surface chemical analysis technique that shows the chemical ion concentration of tin, zinc, and oxygen, as a function of the distance from the surface of tin-zinc particles toward the center of the particles. As shown in FIG. 2, on the very surface 202, the tin ion concentration is near zero 204, while the zinc and oxygen concentrations, 206 and 208 are about 40% and 50%, respectively. This plot shows that although the bulk composition of a tin-zinc particle is 91% tin and 9% zinc (wt %), the surface is primarily zinc. Since zinc is more negative in the emf series than tin it is more preferable in terms of energy reduction for zinc to form a zinc oxide shell than for tin to form a tin oxide shell.

As shown in FIG. 2, at the 50 angstrom depth 210 of a tin-zinc particle, the ratio of tin to zinc approaches the bulk composition of 91Sn-9Zn. The disproportion between tin and zinc exists only in the first 50-angstrom of the surface, or only for a few atomic layers. FIG. 2 also shows that the concentration ratio of oxygen to zinc is higher at the surface 202 than that at the 50-angstrom depth 210. This may indicate that the surface is all zinc oxide, but as depth increases, the particle is a mixture of zinc oxide and zinc.

The complete immersion-tin coating on eutectic 91Sn-9Zn solder material is thus possible because the powder surface is very zinc rich; however, the zinc oxide needs to be removed or its thickness needs to be reduced, before immersion-tin coating will work. The zinc oxide may be removed by treating the solder material with an acid such as hydrochloric acid as is known by those of ordinary skill in the art.

EXAMPLES

Example I

Figure 4:
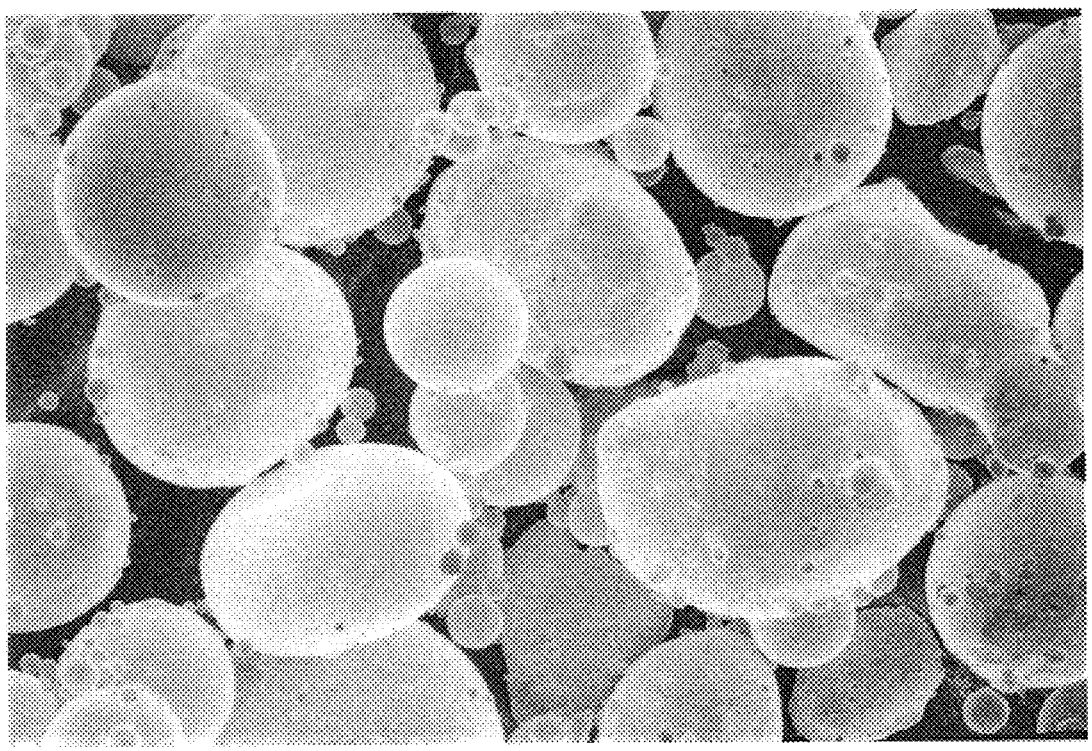
FIG. 4 is a picture taken from a scanning electron microscope ("SEM") of a eutectic 91Sn-9Zn powder.

Immersion Coating a Sn—Zn Alloy Particle with Sn Coating:

A commercially available powder of eutectic 91Sn 9Zn zinc alloy particles was obtained from Indium Corp. of America, 1676 Lincoln Ave., Utica, N.Y. 13502. FIG. 4 is a picture taken from a scanning electron microscope of the tin-zinc powder. The powder contains particles of varying diameters from about 5 to 60 microns.

The powder was placed in a beaker with de-ionized water. Hydrochloric acid ("HCl") of 37% (by volume) was poured into the beaker, such that the concentration of HCl is about 5% by volume. The solution and powder was mixed with a glass stir rod at room temperature for about 5 minutes. The HCl solution was then separated from the powder and replaced with fresh de-ionized water. The water and powder were again mixed and the water was replaced with fresh de-ionized water. The washing with de-ionized water occurred 3 times.

A commercially available immersion-tin solution, specifically Tinplate RD63 without thiourea, was obtained from RD Chemical Company, 1350 Pear Ave, Mountain View, Calif. 94047.

The de-ionized water in the beaker containing the tin-zinc powder was separated and the immersion tin solution was added to the powder. The powder and immersion-tin solution were mixed with a glass stir rod for about 5 minutes at room temperature. After 5 minutes, the immersion solution was separated from the powder, which was then washed with fresh de-ionized water for about 5 minutes. The wash step was repeated two more times. After the washing steps, the powder was placed on a glass plate, and dried in a nitrogen box for between 5–10 minutes.

The amount of powder, HCl, and water used is not critical, provided that the amount of liquid (either HCl or water) is sufficient to cover the powder in the beaker.

Figure 5:
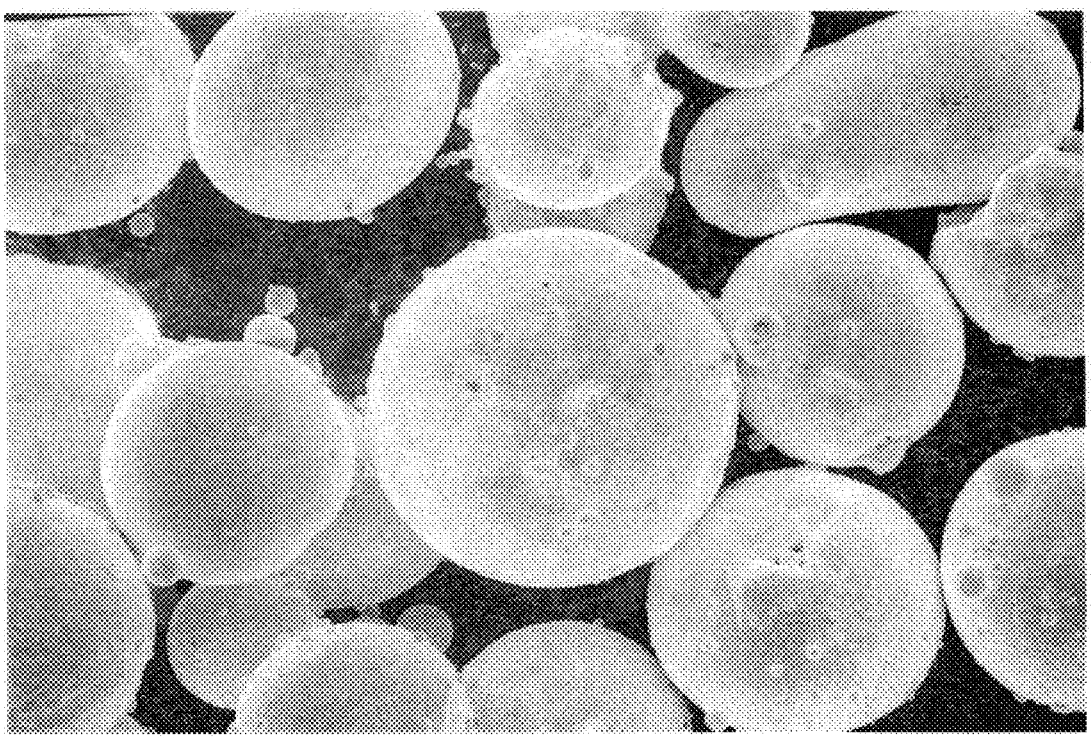
FIG. 5 is a picture taken from a SEM of an immersion-tin coated eutectic 91Sn-9Zn powder.

A series of characterizations were done on the coated tin-zinc powder. FIG. 5 is a picture taken from a scanning electron microscope of the tin-zinc powder after the immersion-tin coating.

Figure 6:
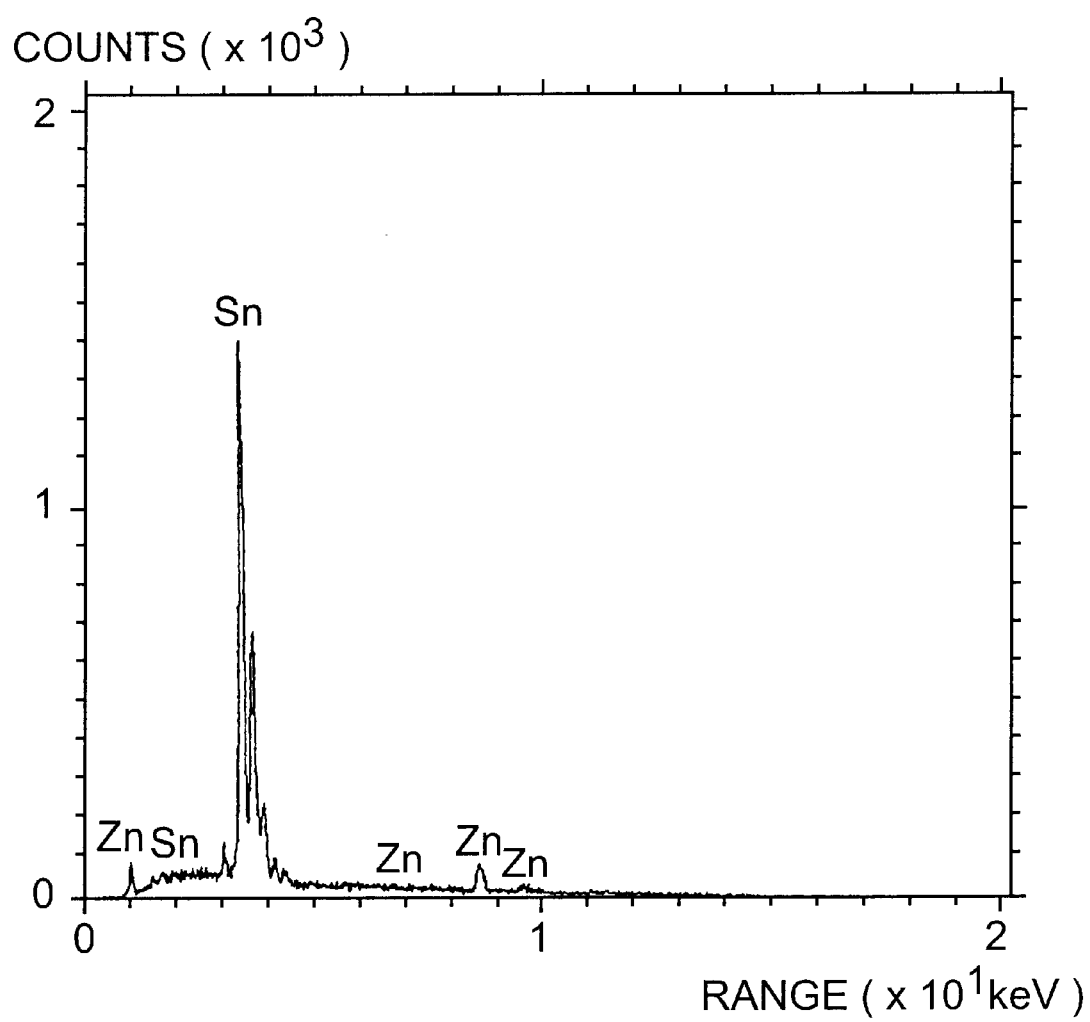
FIG. 6 is a chemical composition plot measured by energy dispersive x-ray ("EDX") for a eutectic 91Sn-9Zn powder.
Figure 7:
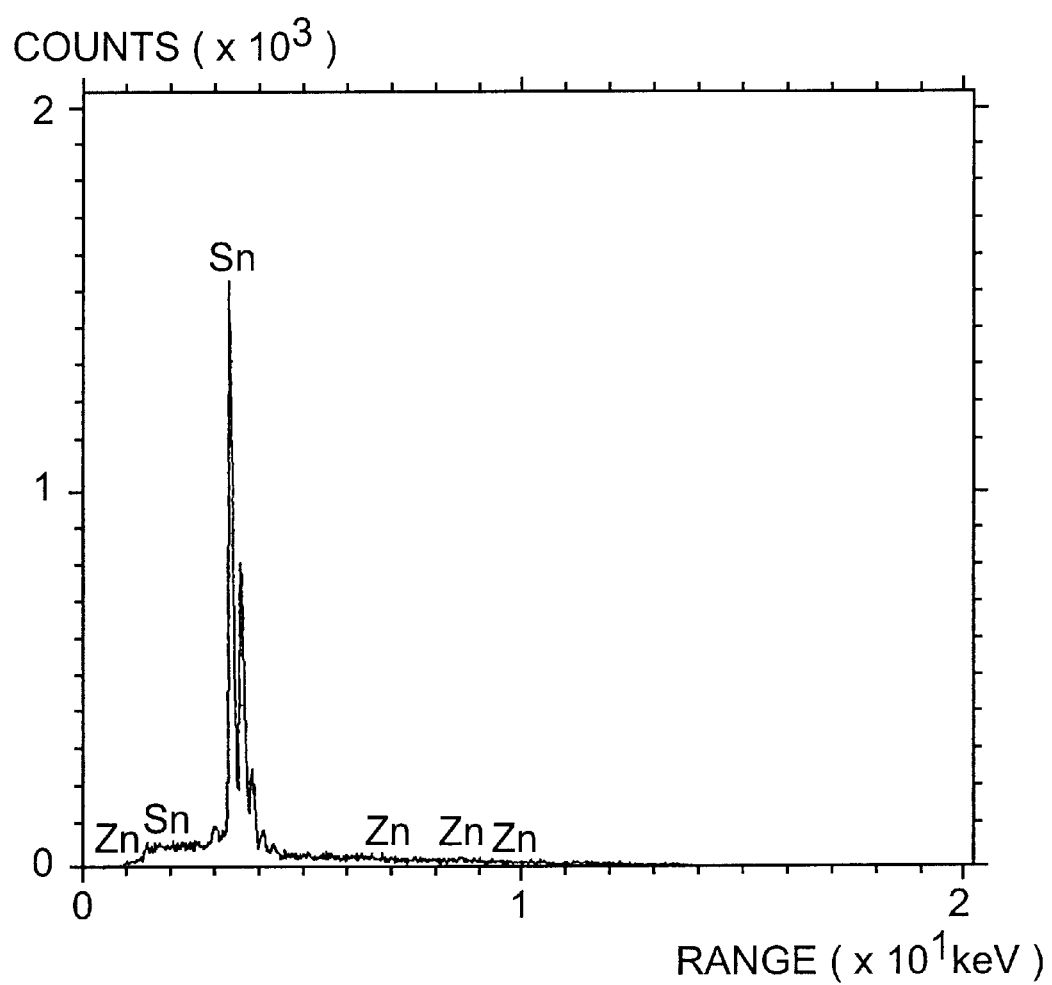
FIG. 7 is a chemical composition plot measured by EDX for an immersion-tin coated eutectic 91Sn-9Zn powder.

FIGS. 6 and 7 are energy dispersive x-ray ("EDX") spectra obtained from a scanning electronic microscope on a tin-zinc particle before the immersion coating (FIG. 6), and a particle after the immersion coating (FIG. 7). A comparison of FIGS. 6 and 7 show that the zinc peaks present in the spectrum of the particle prior to coating are not present or are significantly reduced in the spectrum of the immersion-coated tin-zinc particle. The voltage used in EDX was 15 keV, therefore the electron penetration depth was about 1 micron. This result indicates that the zinc ion concentration at the surface, and to a 1 micron depth below the surface has been significantly reduced by the coating of tin.

Figure 8:
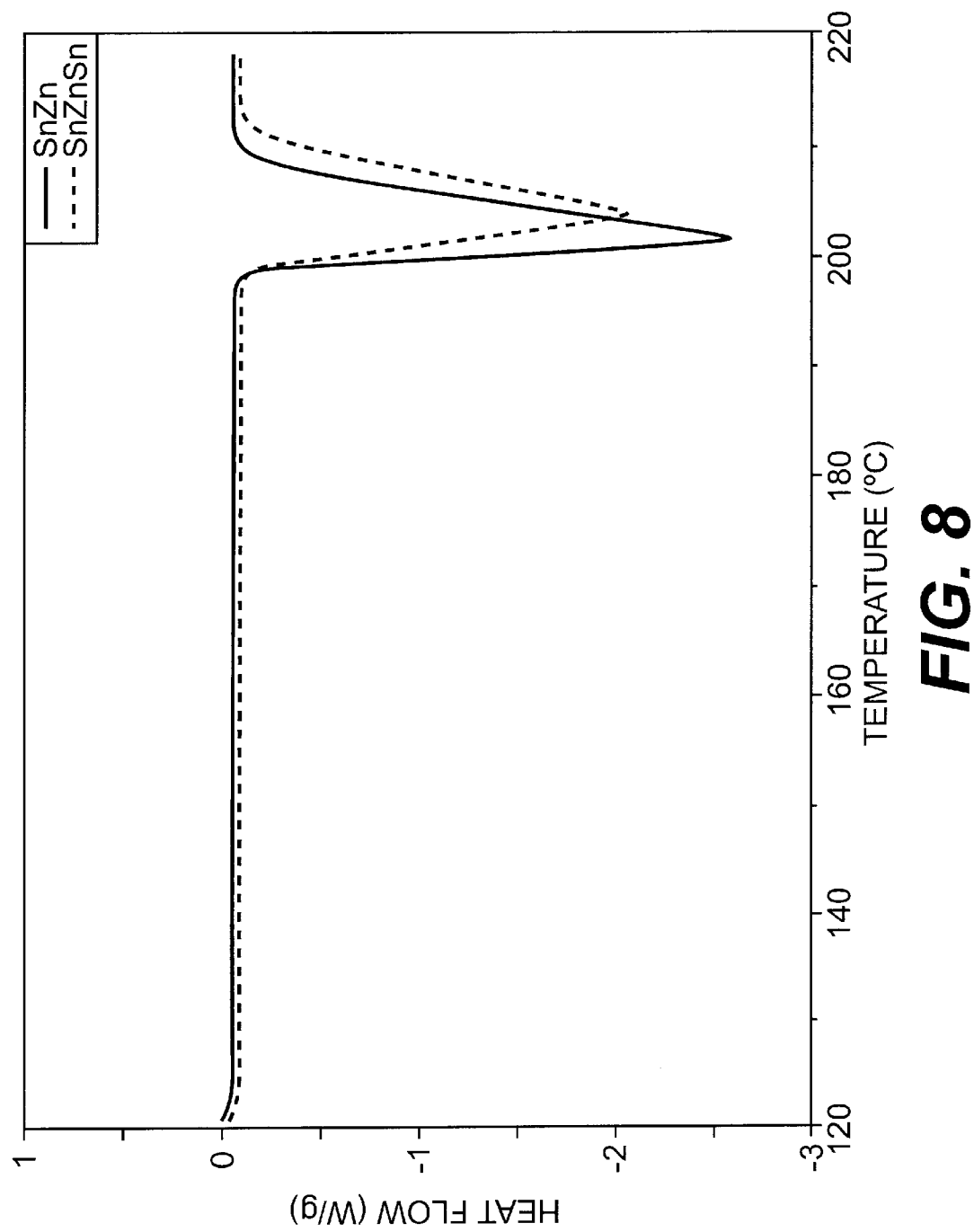
FIG. 8 is a plot of the melting temperatures of eutectic 91Sn-9Zn powder, and the immersion-tin coated Sn-9Zn powder measured by differential scanning calorimetry ("DSC")

FIG. 8 is a differential scanning calorimetery ("DSC") plot measurement of the melting temperatures of eutectic tin-zinc solder material and immersion-tin coated eutectic tin-zinc solder composition 10. It is seen that the melting temperature of the solder material alone is about 201.5° C., and that of coated solder composition is about 203.5° C. This resulting change in melting temperature indicates that a very thin layer of tin has been coated on the solder material thereby creating the immersion coated solder composition.

FIG. 8 indicates that the liquidus temperature (i.e., the temperature at which the melting starts, shown in FIG. 8 as the high temperature edge of the DSC peak) increased about 3° C. after Sn-coating. In order to have a 3° C. liquidus temperature change, the Sn composition change is about 0.78 weight % based on the Sn—Zn phase diagram (Smithells Metals Reference Book, 7th edition, page 11–469). Since the average radius of Sn—Zn powder is about 25 microns, the Sn-coating thickness is calculated to be about 0.83 micron. The details of the calculation are shown below:

| | |
|---|---|
| From DCS (FIG. 8), liquidus temperature change (° C.) = | 3 |
| From Sn—Zn phase diagram, the slope temp vs Sn composition is (° C./wt %) | 3.84 |
| Therefore, the Sn composition change should be (wt %): | 0.78 |
| Density of Zn (g/cm$^3$) = | 7.14 |
| Density of Sn (g/cm$^3$) = | 7.3 |
| Density of 91.4Sn—8.6Zn (g/cm$^3$) = | 7.29 |
| Before coating of Sn: | |
| R, average radius of a Sn—8.6Zn sphere is (micron): | 25 |
| Volume of a Sn—8.6Zn sphere (cm$^3$) = | 6.54E-08 |
| Weight of a Sn—8.6Zn sphere (g) = | 4.77E-07 |
| Weight of Sn in a Sn—8.6Zn sphere (g) = | 4.36E-07 |
| Weight of Zn in a Sn—8.6Zn sphere (g) | 4.10E-08 |
| After coating of Sn: | |
| The Sn composition in a coated sphere is (wt %) = | 92.44167 |
| The Zn composition in a coated sphere is (wt %) = | 7.558333 |
| The weight of Sn coating (g) = | 6.57E-08 |
| The volume of Sn coating (cm$^3$) = | 9.00E-09 |
| Coating thickness (micron) = | 0.83 |

Figure 3:
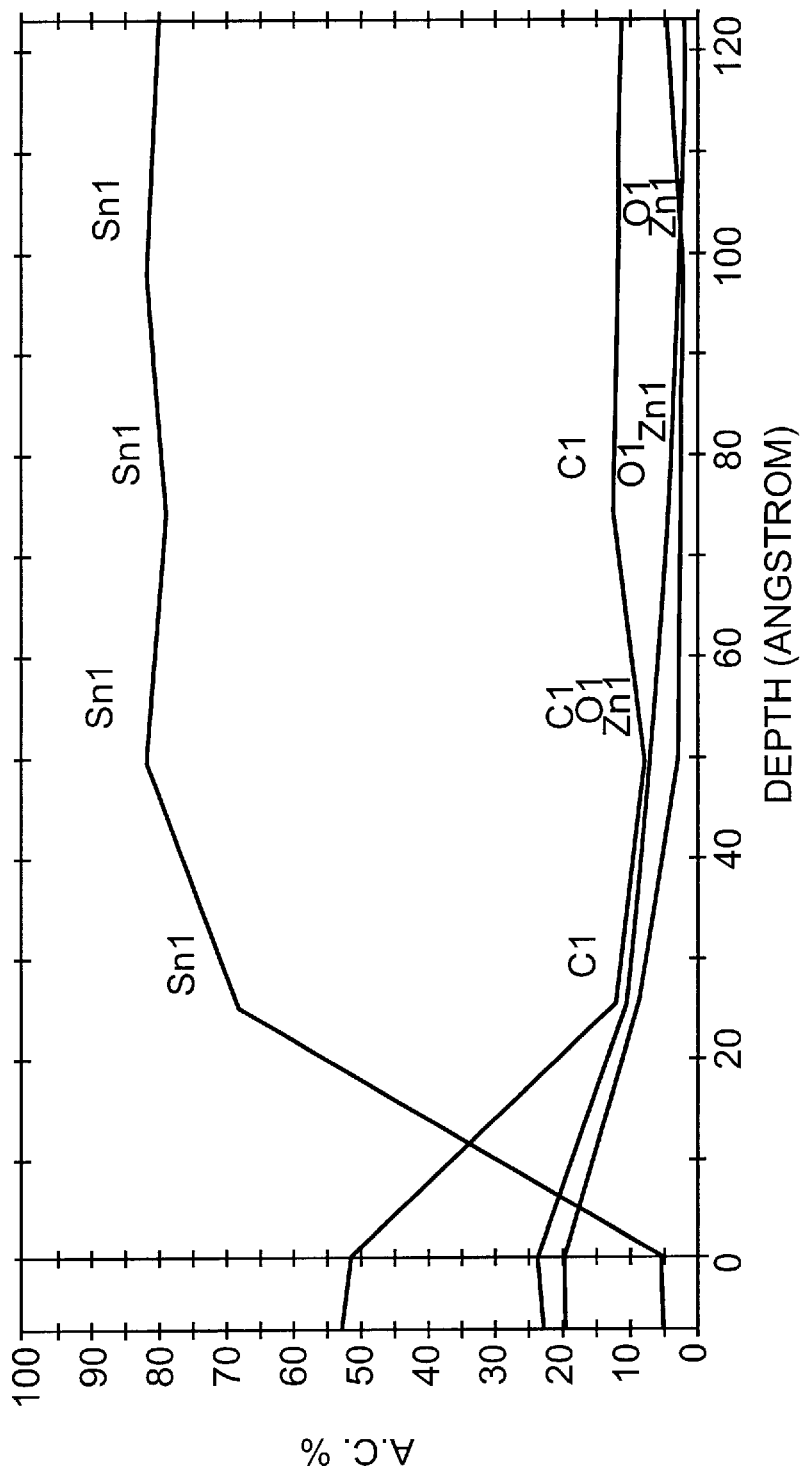
FIG. 3 is a plot showing the atomic composition of a tin coated eutectic 91Sn-9Zn alloy particle vs. the distance from the surface towards the inside of the alloy particle, measured by an Auger microscope.

FIG. 3 plots the chemical compositions of tin, zinc and oxygen, obtained by an Auger spectroscope, as function of the distance from the surface of a solder composition toward the center of the material. In comparison with FIG. 2 the plot obtained from the solder material itself, the zinc concentration on the surface was significantly reduced.

Example II

Measurement of Wetting Characteristics:

To evaluate the effect of immersion-tin coating on the wetting behavior of solder composition and solder pastes made from tin and zinc, two separate solder pastes were prepared, one using the solder composition prepared according to Example I and the other prepared using an uncoated eutectic 91Sn-9Zn solder powder. Each solder composition was mixed with a commercial RMA no-clean flux available from Indium Corp. of America, 1676 Lincoln Ave., Utica, N.Y. 13502. Each solder paste was prepared by combining about 40–50% (by volume) of flux with about 50–60% (by volume) solder composition.

The substrate surfaces used in the experiment are prepared by vacuum evaporation of chromium, platinum and gold onto a silicon wafer. The thickness of each layer was about 500 angstroms of chromium, 1000 angstroms of platinum and 1000 angstroms of gold.

The wetting tests comprised placing small amounts of the two solder pastes on a substrate surface. The substrate surfaces containing the solder pastes were then placed in a laboratory heater. The heater was sealed with a glass top, so the environment could be controlled, and the solder melting could be readily observed through the glass. Helium gas was pumped into the heater for two minutes prior to the commencement of heating and continued throughout the experiment. The heating was controlled by adjusting the electric current of the heater. The solder paste on the substrate was heated to about 150° C. in about twenty seconds. The temperature was held at 150° C. for about one minute. At 150° C., the solder flux boils out. After about one minute, the majority of the flux had bubbled out. The heater was then increased to about 220° C. to melt the solder. After about twenty seconds, the solder had melted and the heater was brought back down to room temperature.

Figure 9:
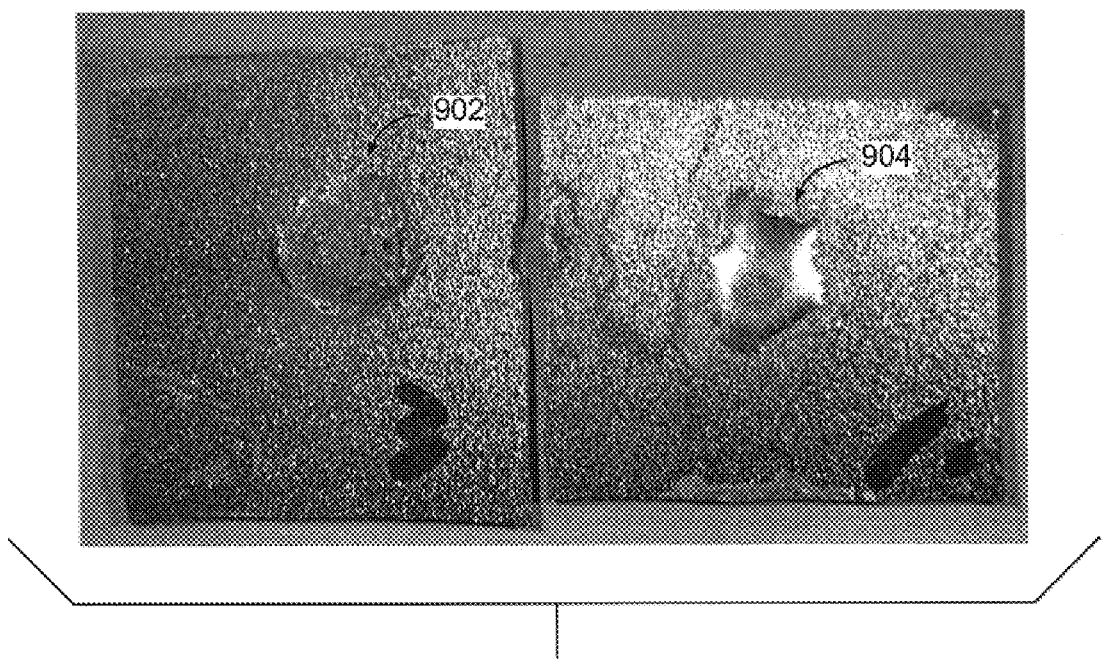
FIG. 9 is a photograph of the results of a wetting test showing a coated solder paste and an uncoated solder paste.

FIG. 9 shows a picture of the results of the wetting test. In FIG. 9, the uncoated solder paste 902 is on the left and coated solder paste 904 using the coated solder composition prepared according to Example I is on the right. As can be seen from FIG. 9, the uncoated solder composition 902 did not wet, or spread onto the substrate. While, some wetting was observable at the solder bump and the substrate interface, the solder powder did not break and completely melt into a whole body. In fact, solder balls are still visible. The coated solder composition 904, on the other hand, shows noticeably improved spreading. Also, the walls of the solder particles have broken and formed a complete whole body. This can be seen by the smooth surface. This shows the improved wetting characteristics of the coated solder composition of the present invention.

While the invention has been described with reference to preferred embodiments thereof, it will be understood by those of ordinary skill in the art that various other changes in the compositions, components, methods, and products made by such methods may be made without departing from the scope of the invention.

What is claimed is:

1. A solder composition comprising:
   a substantially lead-free solder material comprising tin and zinc; and
   an immersion coating material consisting essentially of one of tin and a tin alloy, and having a thickness between 0.5 and 0.83 microns disposed about said solder material such that said solder material melts said coating material from within the solder composition during use.

2. The solder composition of claim 1, wherein said solder material comprises an alloy of tin and zinc.

3. The solder composition of claim 2, wherein said solder material further includes a melting point reducing agent.

4. The solder composition of claim 2, wherein said alloy is between about 80% and about 95% by weight of tin.

5. The solder composition of claim 1, wherein said immersion coating material is tin.

6. The solder composition of claim 4, wherein said melting point reducing agent is selected from the group consisting of silver, indium, silver, and bismuth.

7. The solder composition of claim 1, wherein said solder material is a plurality of eutectic 91Sn-9Zn alloy particles.

8. The solder composition of claim 1, further comprising an effective amount of flux mixed with said solder composition thereby creating a solder paste.

9. The solder composition of claim 7, wherein said alloy particles have a diameter of between about 10 and about 40 microns.

10. A method of making a coated solder composition comprising the steps of
    providing a solder material comprising tin and zinc and;
    coating said solder material with 0.5 to 0.83 microns of a coating material consisting essentially of one of tin and a tin alloy by a process selected from the group consisting of immersion coating and electroless plating.

11. The method of claim 10 wherein said coating step is performed by immersion coating said solder material with said coating material.

12. The method of claim 10 wherein said solder material comprises an alloy of zinc and tin.

13. The method of claim 10 wherein said solder material is eutectic 91Sn-9Zn.

14. The method of claim 10 wherein said coating material is tin.

15. The method of claim 10 wherein said solder material further comprises a melting point reducing agent.

16. The method of claim 15 wherein said solder composition has a melting point of less than about 192°C.

17. The method of claim 15 wherein said melting point reducing agent is selected from the group consisting of indium, silver, and bismuth.

18. The method of claim 10 further comprising:
    mixing an effective amount of flux with said coated solder powder composition thereby creating a solder paste.

19. A method of making a coated lead-free solder comprising:
    providing eutectic 91Zn-9Sn solder powder, and
    coating said solder powder with a tin layer having a thickness between 0.5 and 0.83 microns by a process selected from the group consisting of immersion coating and electroless plating.

* * * * *